(12) United States Patent
Ahn et al.

(10) Patent No.: US 7,596,666 B2
(45) Date of Patent: Sep. 29, 2009

(54) MULTI-PATH ACCESSIBLE SEMICONDUCTOR MEMORY DEVICE HAVING PORT STATE SIGNALING FUNCTION

(75) Inventors: Hyo-Joo Ahn, Seoul (KR); Chi-Sung Oh, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 248 days.

(21) Appl. No.: 11/466,399

(22) Filed: Aug. 22, 2006

(65) Prior Publication Data

US 2007/0150669 A1 Jun. 28, 2007

(30) Foreign Application Priority Data

Dec. 22, 2005 (KR) .................. 10-2005-0127526

(51) Int. Cl.
*G06F 12/00* (2006.01)
(52) U.S. Cl. ..................................... 711/149
(58) Field of Classification Search ........................ None
See application file for complete search history.

(56) References Cited

U.S. PATENT DOCUMENTS

| 5,586,299 | A | * | 12/1996 | Wakerly | .................... 711/149 |
|---|---|---|---|---|---|
| 6,108,756 | A | * | 8/2000 | Miller et al. | ................. 711/148 |
| 6,401,176 | B1 | * | 6/2002 | Fadavi-Ardekani et al. | . 711/151 |
| 6,928,523 | B2 | * | 8/2005 | Yamada | ...................... 711/147 |
| 7,127,563 | B2 | * | 10/2006 | Rader | ......................... 711/148 |
| 2002/0059502 | A1 | * | 5/2002 | Reimer et al. | ............... 711/152 |
| 2003/0093628 | A1 | | 5/2003 | Matter et al. | |
| 2005/0268050 | A1 | * | 12/2005 | Suh | ............................ 711/149 |

* cited by examiner

*Primary Examiner*—Hiep T Nguyen
(74) *Attorney, Agent, or Firm*—Marger Johnson & McCollom, P.C.

(57) ABSTRACT

A multi-path accessible semiconductor memory device having a shared memory area in a DRAM memory cell array that can be randomly accessed by a plurality of processors is provided. The multi-path accessible semiconductor memory device includes at least one shared memory area allocated in a memory cell array, operably connected to ports corresponding to a plurality of processors, each port used by the corresponding processor to selective access the shared memory area. The device further comprises an occupancy state signaling unit to output port occupancy state information to the processor requesting access to the shared memory area through the port used for the access request to indicate whether access to the shared memory area is allowed.

19 Claims, 10 Drawing Sheets

MULTI-PATH ACCESSIBLE SEMICONDUCTOR MEMORY DEVICE HAVING PORT STATE SIGNALING FUNCTION

CROSS-REFERENCE TO RELATED APPLICATION

This application claims the benefit of Korean Patent Application No. 10-2005-127526, filed Dec. 22, 2005, the disclosure of which is hereby incorporated herein by reference in its entirety.

BACKGROUND OF THE INVENTION

1. Technical Field

The invention relates to a semiconductor memory device and, more particularly, to a multi-path accessible semiconductor memory device that is suitable for a portable communication system.

2. Discussion of Related Art

In general, a semiconductor memory device having a plurality of access ports is called a multi-port memory device. Particularly, a memory device having two access ports is called a dual-port memory. A typical and well known dual-port memory is an image processing video memory having a random access memory (RAM) port enabling accessing in a random sequence and a serial access memory (SAM) port enabling accessing only in a serial sequence.

On the other hand, a dynamic random access memory (DRAM) in which a shared memory area in a memory cell array including DRAM cells with no SAM port may be read or written through a plurality of access ports. Hereinafter, DRAM is referred to as a multi-path accessible semiconductor memory device so that it is distinguished from a multi-port memory such as the video memory.

For modern portable electronic systems such as handheld phones or personal digital assistants (PDAs), manufacturers have developed multi-processor systems equipped with a plurality of processors to perform functions faster and to allow smoother operations, as shown in FIG. 1.

Referring to FIG. 1, a first processor 10 and a second processor 12 are connected with each other via a connection line L10; a NOR memory 14 and a DRAM 16 are connected to the first processor 10 via buses B1 to B3; and a DRAM 18 and a NAND memory 20 are connected to the second processor 12 via buses B4 to B6. The first processor 10 may have a MODEM function of modulating and demodulating a communication signal, and the second processor 12 may have an application function of processing communication data or performing games, moving images, and the like. The NOR memory 14 having a cell array of a NOR structure and the NAND memory 20 having a cell array of a NAND structure are both non-volatile memories each including transistor memory cells with a floating gate. The NOR memory 14 and the NAND memory 20 store data, e.g., a unique code and preserved data of a portable device, which should be not erased even when power is off. DRAMS 16 and 18 function as main memories for data processing at the processors 10, 12.

In the multi-processor system as shown in FIG. 1, the DRAMs are allocated to each corresponding processor, and relatively low speed UART, SPI and SRAM interfaces are used. Accordingly, it is difficult to obtain a sufficient data transmission rate. In addition, the structure is complex and cost increases. A scheme for reducing occupancy size, increasing data transmission rate, and reducing the number of memories is shown in FIG. 2.

Referring to FIG. 2, one DRAM 17 is connected to first and second processors 10 and 12 through buses B1 and B2, unlike the system of FIG. 1. In the multi-processor system of FIG. 2, two ports need to be connected to the corresponding buses B1 and B2 in order to enable the respective processors to access the DRAM 17 through the two paths.

A typical DRAM is a memory 1 having a single input/output path 16 and a single port PO, as shown in FIG. 3. The typical DRAM structure comprises a memory cell array that may include first to fourth banks 3, 4, 5 and 6, each having a row decoder 8 and a column decoder 7. An upper input/output sense amplifier and driver 13 is operably connected to the first bank 3 or the third bank 5 via a multiplexer 11 or 12, and a lower input/output sense amplifier and driver 15 is operably connected to the second bank 4 or the fourth bank 6 via a multiplexer 19 or 14. In this typical DRAM structure, a process of outputting the read data from two memory banks is as follows. For example, when data stored in a selected memory cell in the first bank 3 is read, the selected word line is activated. Data in the memory cell sensed and amplified by a bit line sense amplifier in the array is transferred to a local input/output line pair (LIO) 9 through an activated column select line CSL. The data transferred to the local input/output line pair (LIO) 9 is transferred to a global input/output line pair (GIO) 10 by switching operation of a first multiplexer 21. The second multiplexer 11 connected to the global input/output line pair (GIO) 10 transfers the data on the global input/output line pair 10 to the upper input/output sense amplifier and driver 13. The data sensed and amplified by the input/output sense amplifier and driver 13 is then output to the data output line L5 through a path 16. Meanwhile, when data stored in a memory cell in the fourth bank 6 is read, the data is output to an output terminal DQ via a multiplexer 24—the multiplexer 14—the lower input/output sense amplifier and driver 15—the path 16—the data output line L5. As seen above, DRAM 1 of FIG. 3 is a single port memory in which the two banks share one input/output sense amplifier and driver and data input/output is performed through one port PO. As a result, DRAM 1 of FIG. 3 may be applied only to the system of FIG. 1 and is difficult to apply to the multi-processor system of FIG. 2 due to the structures of the memory banks and the port.

In order to implement a memory suitable for the multi-processor system as shown in FIG. 2, a shared memory area can be accessed by a plurality of processors as shown in FIG. 4 and disclosed in U.S. Publication No. 2003/0093628 published on May 15, 2003.

Referring to FIG. 4, a multi-processor system 50 is shown in which a memory array 35 includes first, second and third portions. In the memory array 35, the first portion 33 is accessed only by a first processor 70 through a port 37, the second portion 31 is accessed only by a second processor 80 through a port 38, and the third portion 32 is accessed by both the first and second processors 70 and 80. Here, sizes of the first and second portions 33 and 31 in the memory array 35 may be changed depending on a load of the first and second processors 70 and 80, and the memory array 35 is of a memory type or a disc storage type.

To implement the memory array 35 using a DRAM structure and allow the first and second processors 70 and 80 to share the third portion 32, some problems need to be overcome. For example, there is a need for a technique for effectively laying out memory areas and input/output sense amplifiers in the memory array 35 and for controlling a read/write path for each port. There is also a need for a technique for enabling external processors corresponding to respective ports to recognize a current use state of a shared memory area (e.g., an occupancy state or a busy state).

Accordingly, there is a need for a solution for sharing a memory area of a DRAM memory cell array in a multi-processor system having two or more processors and an enhanced method for notifying one processor of port occupancy state information indicating whether the shared memory area in the memory cell array is accessed by another processor.

SUMMARY OF THE INVENTION

One aspect of the invention provides a semiconductor memory device including: at least one shared memory area allocated in a memory cell array, a plurality of ports corresponding to a plurality of processors, each port used by the corresponding processor to selectively access the shared memory area; and an occupancy state signaling unit to output port occupancy state information to the processor requesting access to the shared memory area through the port used for the access request to indicate whether access to the shared memory area is allowed.

Another aspect of the invention provides a communication system including: a first processor for performing a first set task; a second processor for performing a second set task; and a dynamic random access memory including: a memory cell array including a first memory area accessed by both the first and second processors and a second memory area accessed only by the second processor; first and second ports respectively connected to corresponding buses of the first and second processors; and an occupancy state signaling unit to output port occupancy state information in a first logic state through a port used for a first access request to indicate that access to the shared memory area is allowed, and port occupancy state information in a second logic state through a port used for a subsequent access request to indicate that access to the shared memory area is not allowed.

Yet another aspect of the invention provides a method for signaling shared memory area states of a semiconductor memory device to processors through ports, including: receiving a request for access to the shared memory area; generating an active enable signal responsive to the request for access; generating a control signal responsive to the active enable signal; and outputting port occupancy state information responsive to the control signal to indicate whether access to the shared memory area is allowed.

BRIEF DESCRIPTION OF THE DRAWINGS

The above and other features and advantages of the invention will become more apparent to those of ordinary skill in the art by describing in detail preferred embodiments thereof with reference to the attached drawings in which.

DETAILED DESCRIPTION OF THE INVENTION

The invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 5:
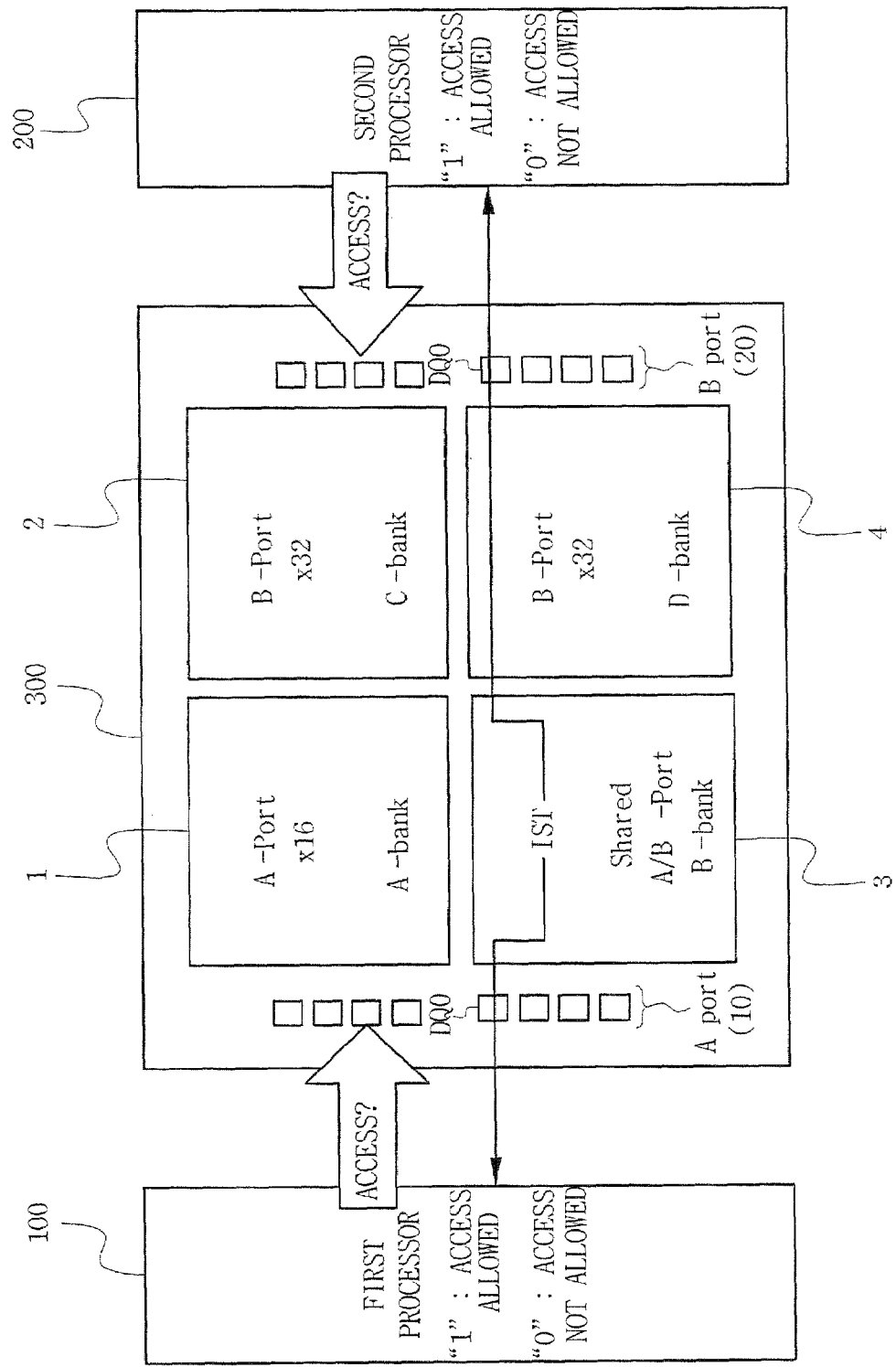
FIG. 5 is a block diagram illustrating a multi-processor system having a multi-path accessible DRAM according to an embodiment of the invention.

FIG. 5 is a block diagram illustrating a multi-processor system having a multi-path accessible DRAM according to an embodiment of the invention. Referring to FIG. 5, the system preferably includes a first processor 100 for performing a first set of tasks, a second processor 200 for performing a second set of tasks, and a DRAM 300 having memory areas 1 to 4 in a memory cell array. The first and the second processors 100, 200 preferably perform different functions. For example, the first processor 100 may have a MODEM function of modulating and demodulating a communication signal or a base band processing function as a processing task, and the second processor 200 may have an application function of processing communication data or performing games, moving images, and the like as a processing task. Further, when the system bus B1 has 16 bits, the system bus B2 may be set as 16 or 32 bit (×16 or ×32).

Figure 1:
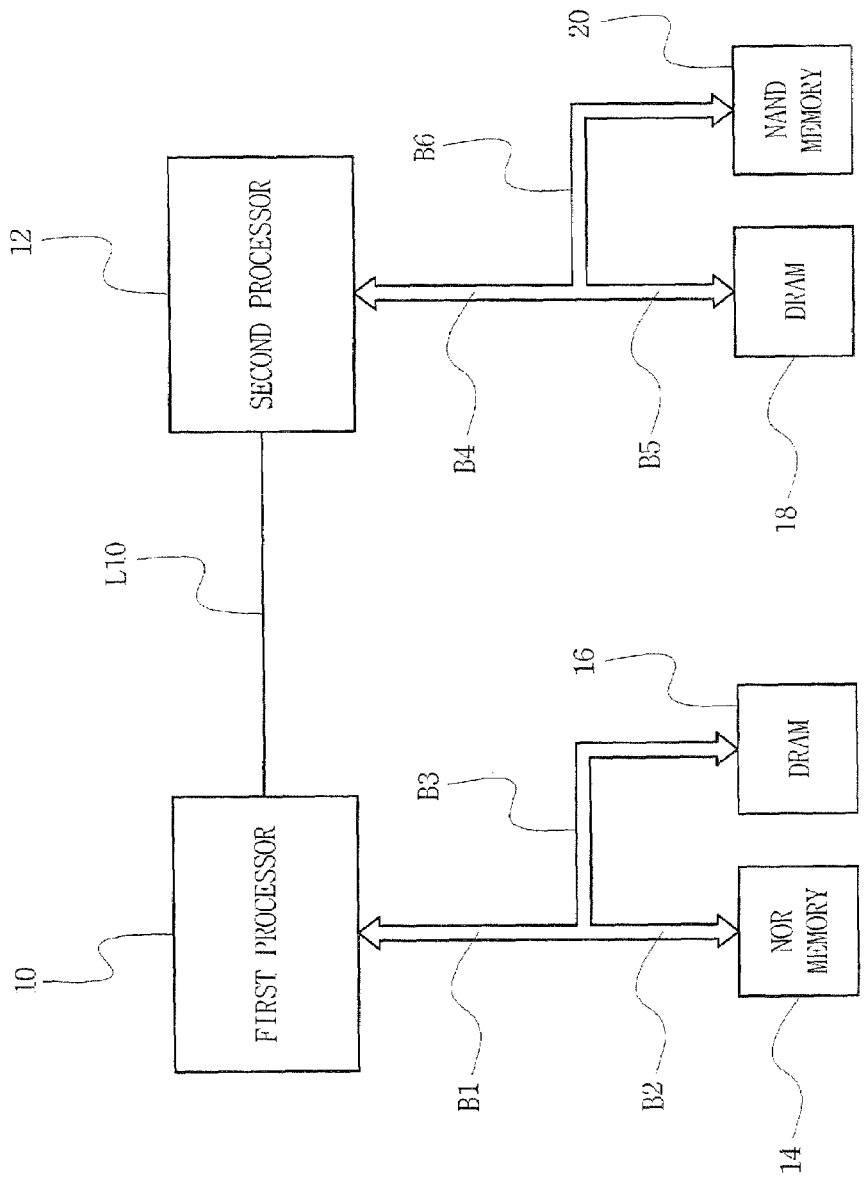
FIG. 1 is a block diagram illustrating a typical multi-processor system employed in a portable communication device.
Figure 2:
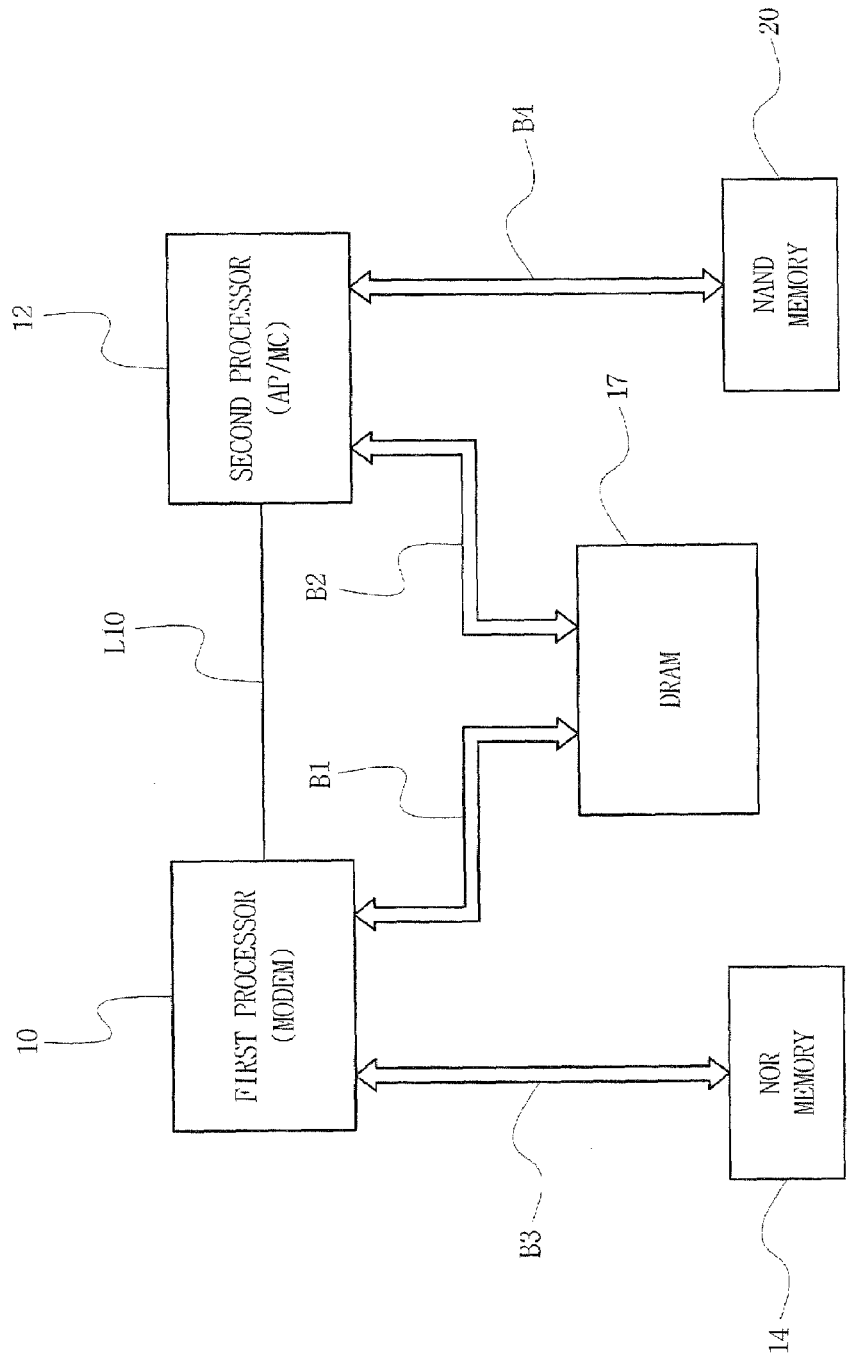
FIG. 2 is a block diagram illustrating a multi-processor system employing a memory according to one embodiment of the invention.

The system may further include a flash memory 20 connected through a bus B4, as shown in FIG. 2. The flash memory 20 is preferably a non-volatile memory including a cell array of a NAND structure in which memory cells include MOS transistors each having a floating gate. The flash memory 20 may store data, e.g., a unique code and reserved data of a portable device which should not be erased even when power is off.

Referring back to FIG. 5, the four memory areas 1 to 4 may be composed of a DRAM bank unit, and each bank may have storage capacity of, for example, 64, 128, 256, 512, or 1024 Mbit. A plurality of memory cells arranged in a matrix form of rows and columns in the memory areas may be DRAM memory cells, each having an access transistor AT and a storage capacitor C.

As shown in FIG. 5, the DRAM 300 has independent ports A and B. However, the invention need not be so limited. The port A is a first port 10 that may be connected to the first processor 100 through the system bus B1 shown in FIG. 2. The port B is a second port 30 that may be connected to the second processor 200 through the system bus B2.

In FIG. 5, the third memory area 3 may be accessed by both the first and second processors 100 and 200 through the first and second ports 10 and 30. The first memory area 1 may be a dedicated memory area that is accessed only by the first processor 100, and the second and fourth memory areas 2 and 4 may be dedicated memory areas that are accessed only by the second processor 200.

When the first processor 100, for example, accesses the first memory area 1 through the first port 10, the second processor 200 can access, at substantially the same time, one of the second, third, and fourth memory areas 2 to 4 through the second port 30. This multi-path access operation may be implemented by properly controlling the access paths at a control circuit (not shown) within the memory 300.

The system of FIG. 5 may be a portable computing device or portable communication device, such as a mobile communication device (e.g., a cellular phone), a bidirectional radio communication system, a unidirectional pager, a bidirectional pager, a personal communication system, or a portable computer, or the like. However, it is to be understood that the scope and application of the invention need not be so limited.

The system of FIG. 5 need not be limited to two processors and may have three or more processors. In the system, the processors may be microprocessors, central processing units (CPUs), digital signal processors, microcontrollers, reduced instruction set computers, complex instruction set computers, or the like. It is to be understood that the number of processors within the system does not limit the scope of the invention. Further, the scope of the invention is not limited to a special combination of the same or different processors.

Figure 6:
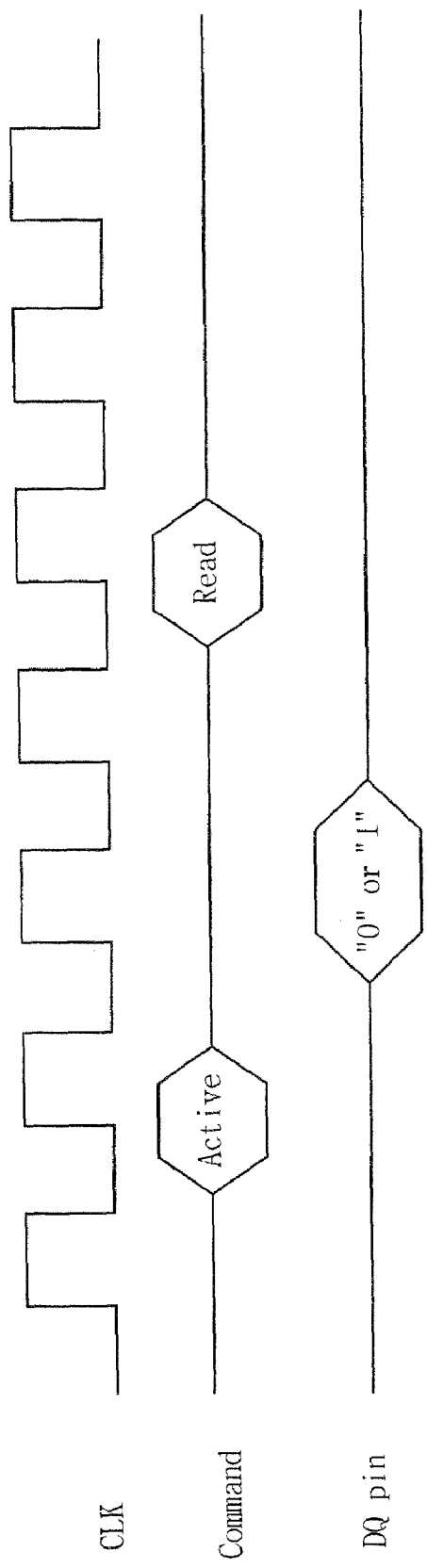
FIGS. 6 and 7 are timing diagrams of outputting port occupancy state information in a multi-path accessible DRAM in FIG. 5.
Figure 7:
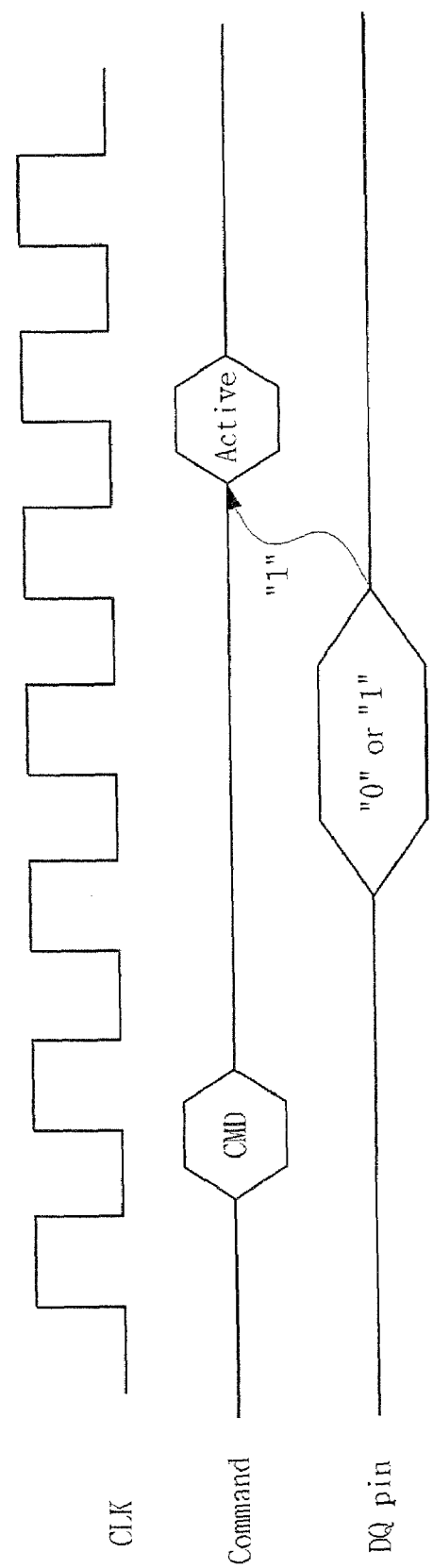

FIGS. 6 and 7 are timing diagrams of outputting port occupancy state information in a multi-path accessible DRAM in FIG. 5. When the first and second processors request access to the shared memory area 3 of the DRAM 300, the port occupancy state information indicates whether access to the shared memory area is allowed.

Referring to FIG. 6, command signals are preferably external signals received from the processors, and port occupancy state information is preferably output to a data output (DQ) pad (or pin) of a plurality of data output pads within the ports. The external signals may include a row address strobe signal (RASB), a write enable signal (WEB), and a bank select address (BA). The port occupancy state information is preferably output to the data output (DQ) pad in response to an active command.

Referring to FIG. 7, set command set signals are preferably external signals received from the processors, and the port occupancy state information is output to the data output (DQ) pad. In FIG. 7, the port occupancy state information is preferably output to the data output pad in response to a command newly defined by the processor.

Figure 8:
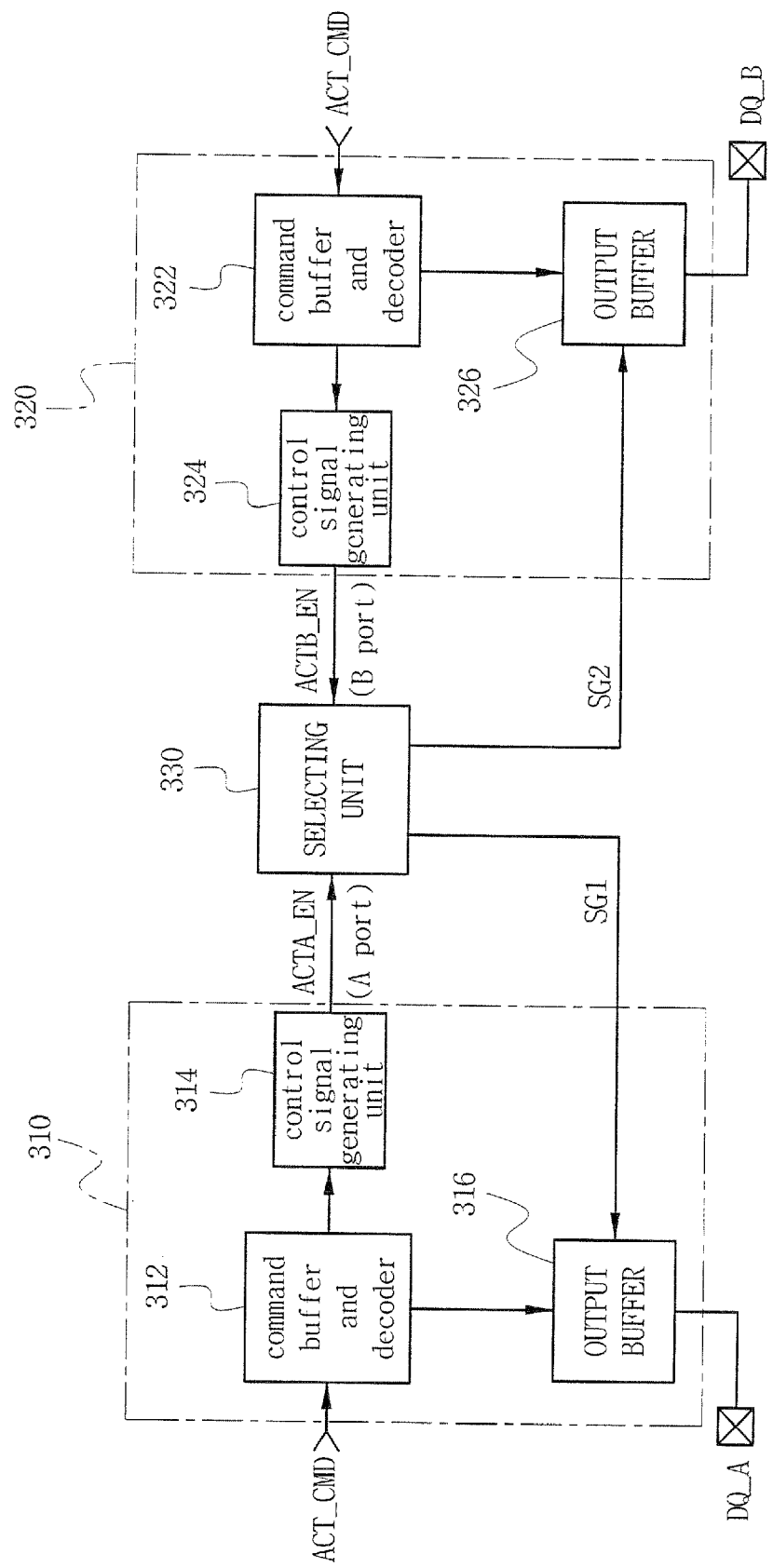
FIG. 8 is a block diagram illustrating an occupancy state signaling unit employed in the memory of FIG. 5.

FIG. 8 is a block diagram illustrating an occupancy state signaling unit employed in the memory of FIG. 5. A first decoding and generating unit 310 preferably comprises a command buffer and decoder 312 and a control signal generating unit 314 for decoding external signals applied through a first port 10 to generate an active enable signal ACTA_EN. Similarly, a second decoding and generating unit 320 preferably comprises a command buffer and decoder 322 and a control signal generating unit 324 for decoding external signals applied through a second port 30 to generate an active enable signal ACTB_EN. A port output selecting unit 330 preferably receives the active enable signals ACTA_EN and ACTB_EN to output first and second select control signals SG1 and SG2, respectively, having opposing logic levels at first and second occupancy state information outputting units comprising output buffers 316 and 326, respectively. The output buffers 316 and 326 output port occupancy state information through data output pads DQ_A and DQ_B corresponding to the first and second ports in response to the first and second select control signals SG1 and SG2 from the port output selecting unit 330, respectively. In one embodiment, when the active enable signal ACTA_EN is generated, the port output selecting unit 330 outputs first select control signal SG1 at a logic high level to enable output buffer 316. The port output selecting unit 330 preferably further outputs second select control signal SG2 at a logic low level to enable output buffer 326.

With the structure of FIG. 8, upon receipt of a request for access to the shared memory area from the first and second processors, the occupancy state signaling unit 330 outputs port occupancy state information to indicate whether access to the shared memory area is allowed. For example, in response to the external signals from the first processor 100 received through the port 10, the occupancy state signaling unit 330 may output a first logic state indicating that access to the shared memory area through the port 10 is allowed. In response to the external signals from the second processor 200 received through the port 30, the occupancy state signaling unit 330 may output a second logic state indicating that access to the shared memory area through the port 30 is not allowed. The external signals may be active command signals or set command set signals applied by the first and second processors.

Figure 9:
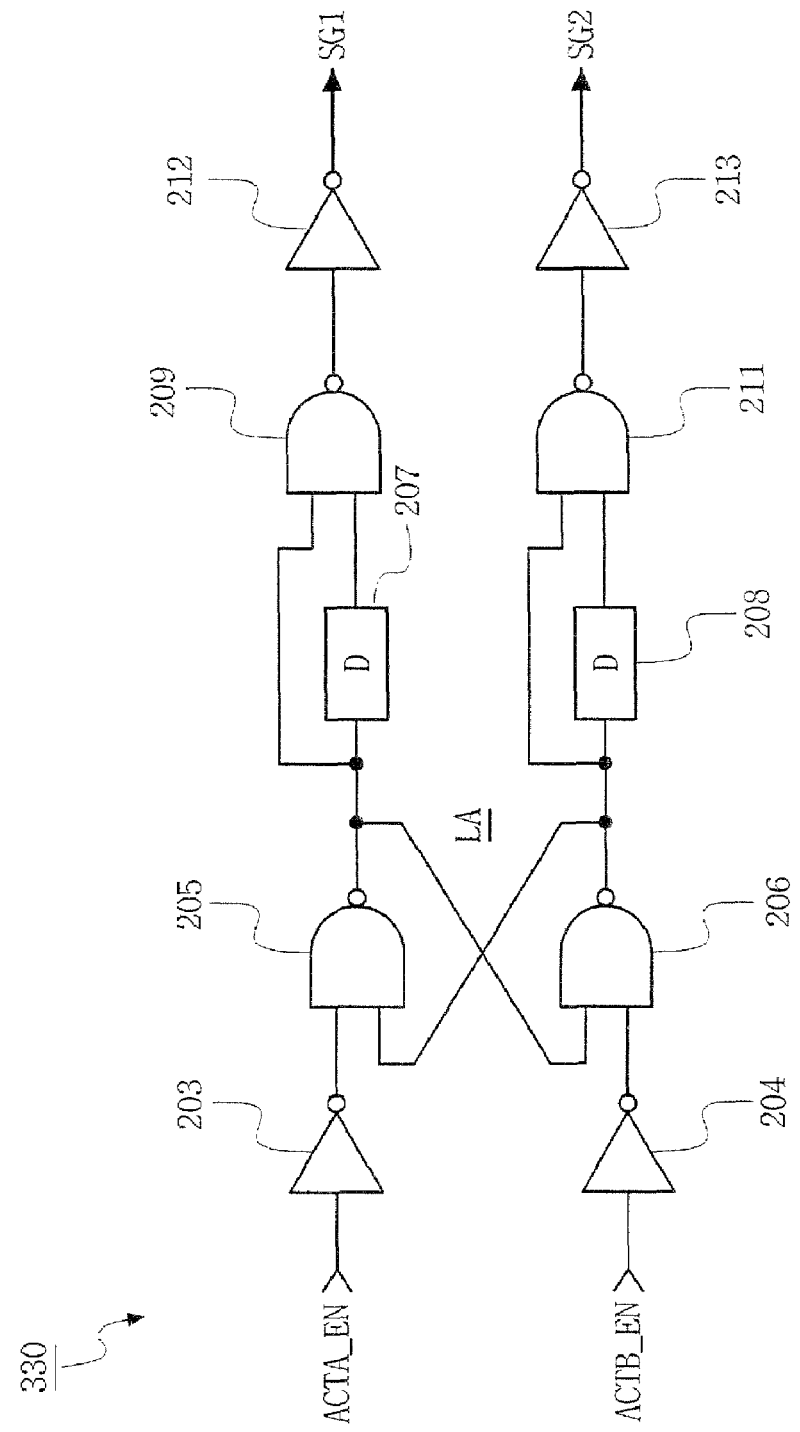
FIG. 9 is a circuit diagram of a selecting unit of FIG. 8.

FIG. 9 is a circuit diagram of the selecting unit 330 of FIG. 8. The selecting unit 330 preferably includes inverters 203, 204, 212, and 213, NAND gates 205 and 206, delay devices 207 and 208, and NAND gates 209 and 211, and may have a wiring structure as shown in FIG. 9. Output signals of the latch LA delayed by a predetermined time preferably correspond to the first and second select control signals SG1 and SG2.

Figure 10:
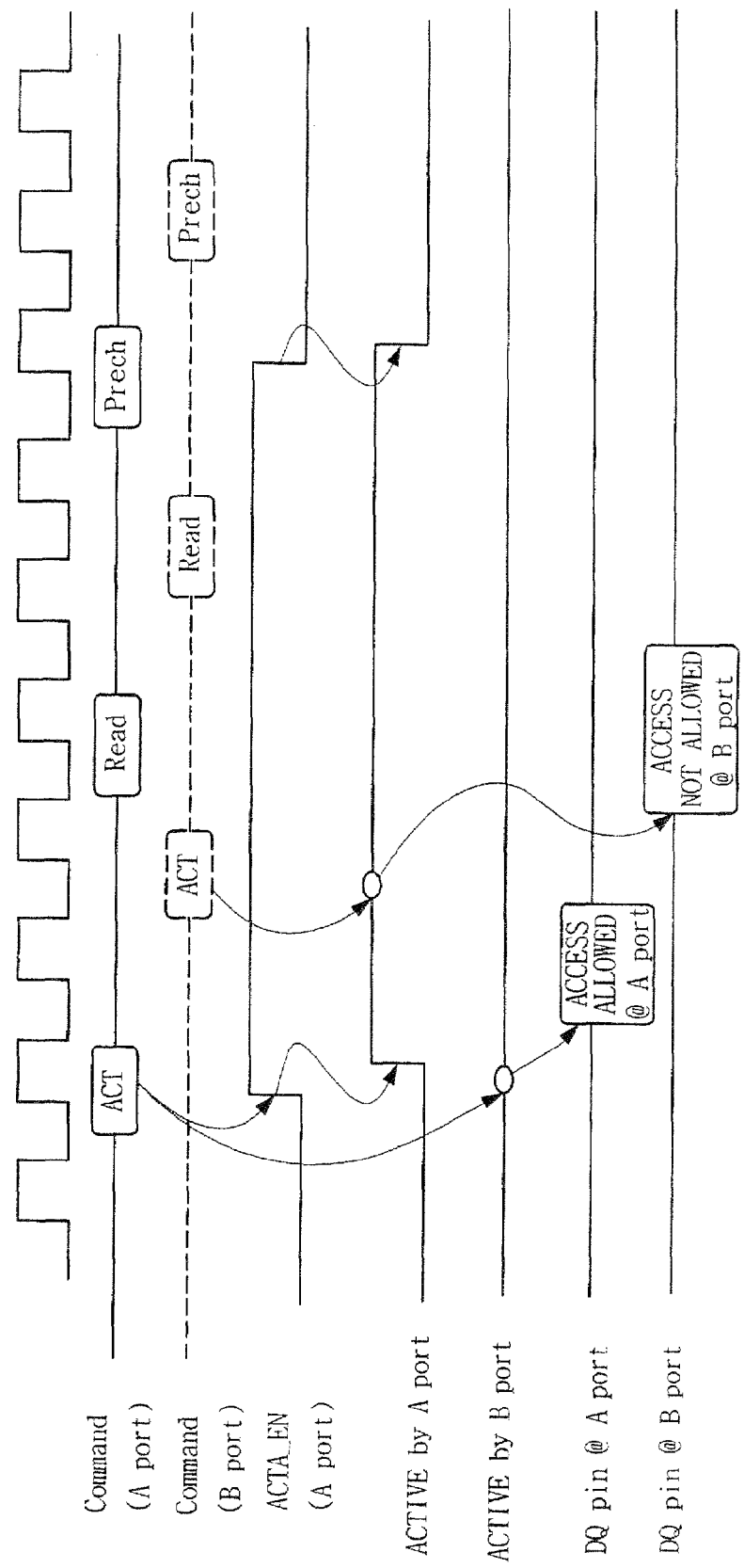
FIG. 10 is a detailed timing diagram related to the operation of FIG. 8.

FIG. 10 is a detailed timing diagram related to the operation of FIG. 8. Referring to FIG. 10, when an active command is applied through the first port 10 and then an active command is subsequently applied through the second port 30, port occupancy state information in a first logic state (e.g., logic high) is preferably output through the first port 10 to indicate that access is allowed, and port occupancy state information in a second logic state (e.g., logic low) is preferably output through the second port 30 to indicate that access is not allowed.

If an active command such as row address strobe signal RASB is simultaneously applied through the two ports, it is desirable that a processor having a priority is allowed to access the shared memory area according to a system's specification.

To apply the operation timing as shown in FIG. 10 to the memory 300 of FIG. 5, input/output sense amplifier and write drivers 13 may be respectively disposed at the left and right sides of the cell array in the shared memory area 3, and first and second global multiplexers 11 performing opposing switching operation may be disposed before the input/output sense amplifier and write drivers.

Referring to FIG. 5 again, in the access operation, the first and second processors 100 and 200 preferably share circuit elements and lines present between typical global input/output line pair GIO and GIOB and the memory cell and independently use input/output related circuit elements and lines from each port to the global multiplexer.

More specifically, the first and second processors 100 and 200 preferably share, through the first and second ports 10 and 30, a global input/output line pair GIO and GIOB (shown as GIO), a local input/output line pair LIO and LIOB (shown as LIO) operably connected to the global input/output line pair GIO and GIOB, a bit line pair BLi and BLBi (not shown) operably connected to the local input/output line pair LIO and LIOB by a column select signal CSL, a bit line sense amplifier disposed in the bit line pair for sensing and amplifying data on the bit line, and all memory cells each having an access transistor connected to the bit line pair, in the shared memory area 3.

Although not shown in FIG. 5, a row address multiplexer and a column address multiplexer are preferably disposed before the row decoder and the column decoder to receive row and column addresses from an occupancy-permitted port. Such an address multiplexer may be implemented by a clocked CMOS inverter composed of P type and N type MOS transistors.

Referring to FIG. 5 again, the operation of accessing the dedicated areas, the first memory area 1 by the first processor 100 and the fourth memory area 4 by the second processor 200, is the same as a data access operation of a typical DRAM. When DRAM 300 of FIG. 5 receives a request for access (i.e., receives various commands and signals read or write operations) to the shared memory area 3 from the processors 100 and 200, a process for outputting port occupancy state information to the respective processors will now be described to assist in understanding the principles of the invention.

If the first processor 100 desires to access the third memory area 3 and perform a read operation, an active command ACT (FIG. 10) is input to the memory 300 through the first port 10 having a connection to the first processor 100. Accordingly, the command buffer and decoder 312 in the first decoding and generating unit 310 of FIG. 8 buffers, decodes the active command, and then applies the decoded command to the control signal generating unit 314. The control signal generating unit 314 generates an active enable signal ACTA_EN for the first port 10 in response to the decoded command. The timing of the generated active enable signal ACTA_EN may be as shown in FIG. 10. The selecting unit 330 of FIG. 8 receives the active enable signal ACTA_EN, generates the first select control signal SG1, and then outputs it to the output buffer 316. Since no other ports are already active, the output buffer 316 outputs port occupancy state information in a first logic state (e.g., logic high) to the data output pad DQ0, one of a plurality of output pads within the first port 10, in order to indicate that access to the shared memory area is allowed. The first processor 100 then recognizes that access to the shared memory area 3 is allowed and, thus, applies a read command subsequent to the active command, as shown in FIG. 10.

In this case, since the read path should be through the first port 10, the row address multiplexer corresponding to the shared memory area 3 selects a row address applied through the first port 10 and outputs it as a select row address. The row decoder, which is connected to the shared memory area 3 and receives an output from the row address multiplexer, activates a word line WLi in the third memory area 3 that the first processor 100 desires to access. If the word line WLi is activated, data in memory cells each including an access transistor AT having a gate connected to the same word line is developed in corresponding bit line pair. For example, when a voltage higher than a power voltage is applied to the gate of the access transistor AT constituting the memory cell by word line boosting operation, different potentials are developed in the bit line BLi according to a state of charges accumulated in a storage capacitor C (e.g., 1.8 to 3 volt in a charging state and 0 volt in a non-charging state). As a result, charge sharing states with the bit line differ between the charging state and the non-charging state, and the difference is sensed and amplified by the bit line sense amplifier within the array. For example, when a potential at the bit line BLi is high and a potential at the bit line bar BLBi as a complementary bit line is low, a ratio of the potentials at the bit line pair BLi and BLBi are delivered to the corresponding local input/output line pair LIO and LIOB when a column gate responding to the column select signal CSL at a high state is turned on.

After the word line WLi is activated and the data in the memory cell appears as a high or low level potential on the bit line pair BLi and BLBi, the column address multiplexer selects a column address A_CADD on the first port 10 and outputs it as a selected column address. The column decoder, which is connected to the output of the column address multiplexer, transfers the potential on the bit line pair BLi and BLBi within the third memory area 3 that the first processor 100 desires to access to the local input/output line pair LIO and LIOB as shown in FIG. 3.

Figure 3:
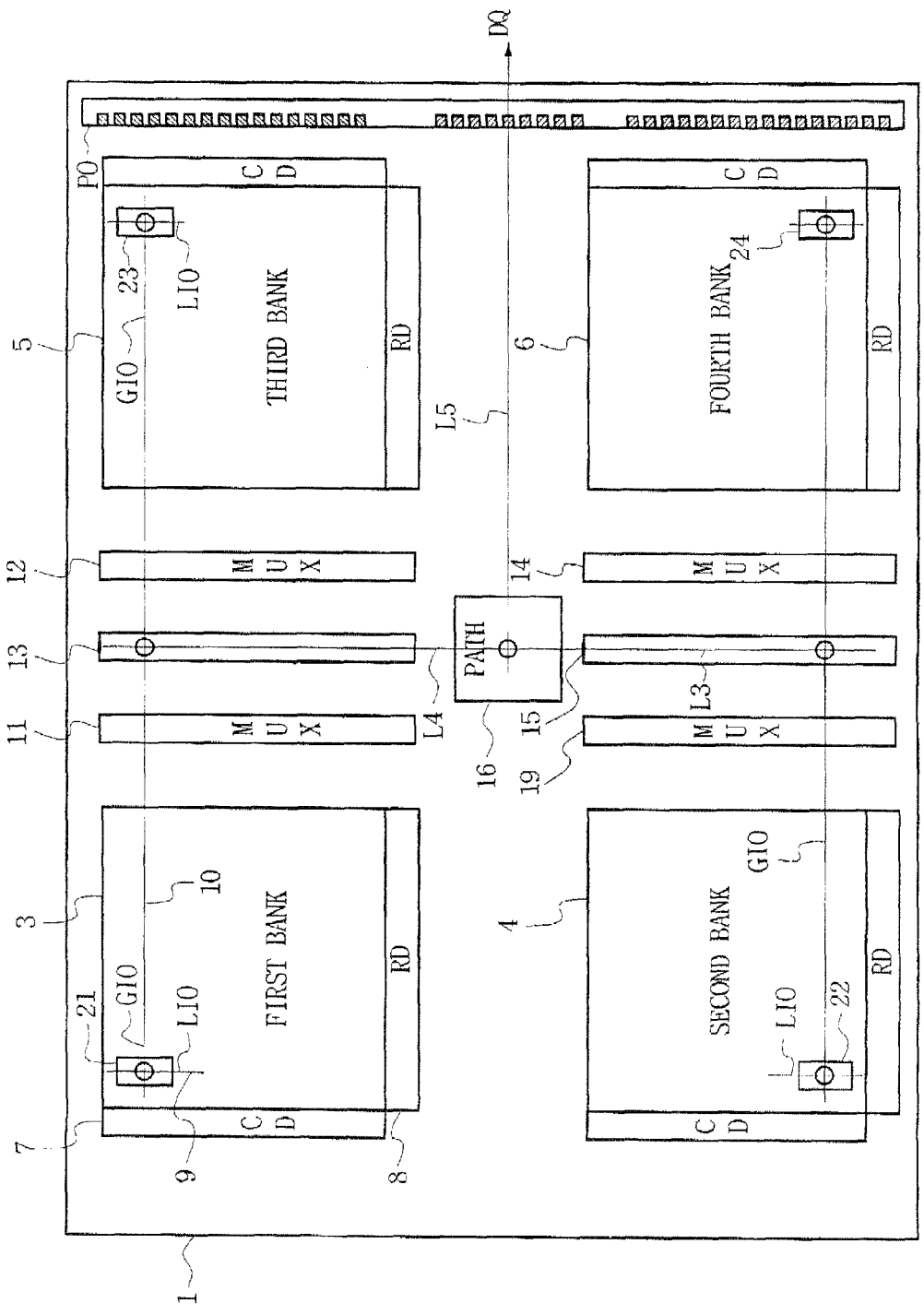
FIG. 3 is a block diagram illustrating an internal structure of a memory cell array in a typical DRAM memory.
Figure 4:
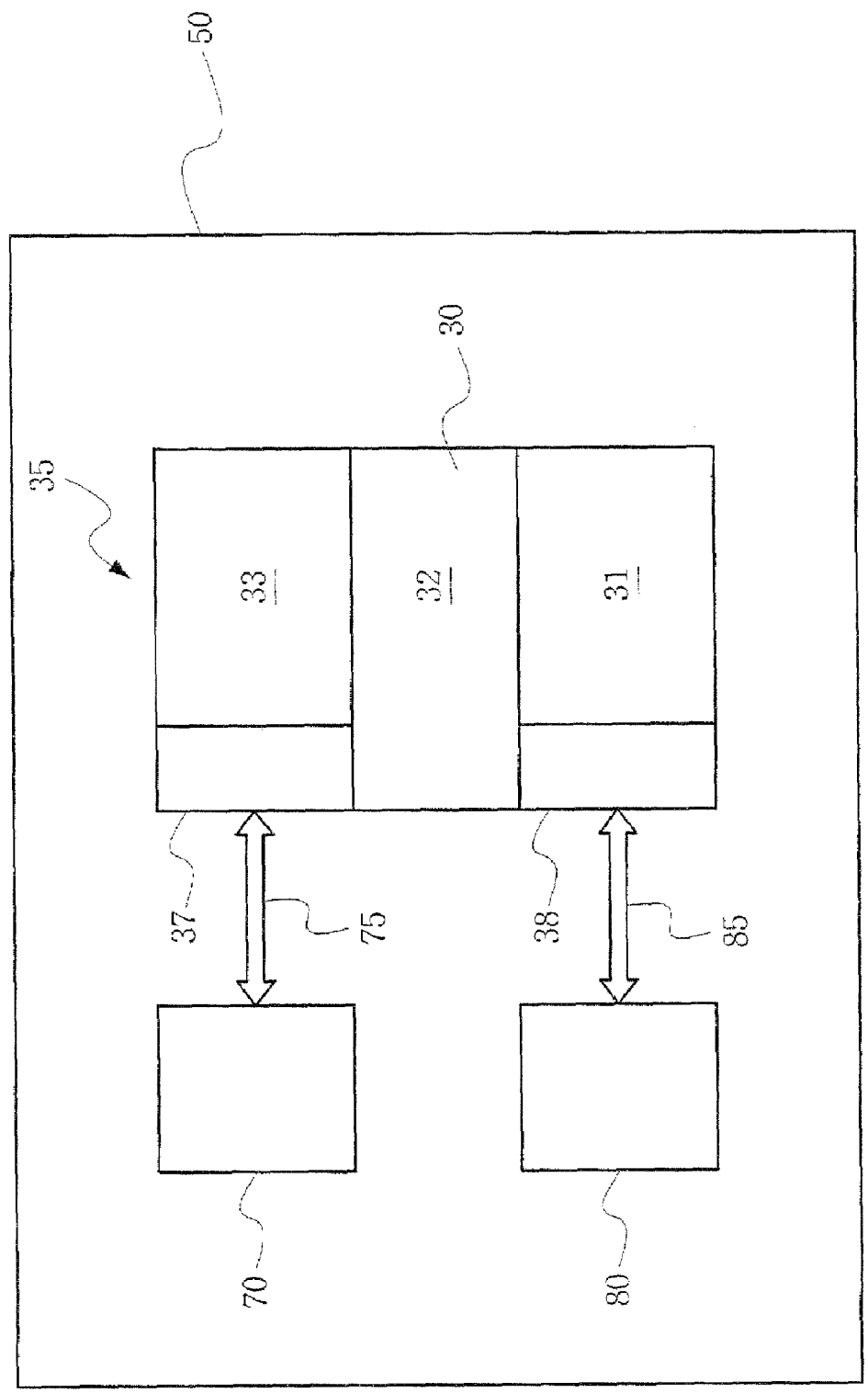
FIG. 4 is a block diagram illustrating memory array portions in a conventional multi-processor system.

The data on the local input/output line pair LIO and LIOB appearing as the potential level is transferred to the global input/output line pair GIO and GIOB as shown in FIG. 3 when N type MOS transistors constituting the first multiplexer 21 of FIG. 3 are turned on. Here, a switching signal LIOC applied to the gates of the N type MOS transistors in common may be a signal that is generated in response to a decoding signal from the row decoder. The data transferred to the global input/output line pair GIO and GIOB is transferred to the input/output sense amplifier and driver through the second multiplexer 11 as described above. In FIG. 3, the input/output sense amplifier 13 further amplifies data whose level is weakened due to transfer through the paths and transfers the amplified data to the output buffer 316 of FIG. 8 through the multiplexer and the driver. Here, since the port occupancy state information at the first logic state (e.g., logic high), which is output through the data output pad DQ0 connected to the output buffer 316, is already reset at this time point, the information does not affect the data read operation.

In this manner, the first processor 100 reads the data stored in the memory cell through the first port 10. In this case, the second processor is blocked from accessing the third memory area 3 through the second port 30. However, the second processor 200 may continue to access the second and fourth memory areas 2 and 4 through the second port 30. Of course, the size and number of the shared memory areas may by changed depending on a load of the first and second processors.

During the above-described read operation at the first processor 100, if the second processor 200 subsequently applies an active command for a read operation through the second port 30 as indicated by a dotted line of FIG. 10, the command buffer and decoder 322 in the second decoding and generating unit 320 of FIG. 8 buffers, decodes the active command, and applies the decoded command to the control signal generating unit 324. The control signal generating unit 324 outputs an active enable signal ACTB_EN to the second port 30 in response to the decoded command. The selecting unit 330 of FIG. 8 receives the active enable signal ACTB_EN, generates the second select control signal SG2, and outputs the second select control signal SG2 to the output buffer 326. As shown in FIG. 10, since port A remains active, the output buffer 326 in the block 320 outputs port occupancy state information in a second logic state (e.g., logic low) to the data output pad DQ0, one of a plurality of output pads within the second port 30, in order to indicate that the access to the shared memory area is not allowed. Thus, the second processor 200 can promptly recognize that the shared memory area is currently in a busy state at substantially the same time with the request for access.

In another embodiment, two of the four memory areas may be set as shared memory areas and other two may be set as dedicated memory areas. Alternatively, all of the four memory areas may be set as the shared memory areas. While the description has been focused on the dual processor, the invention may also be applied to a system employing three or more processors in which one DRAM has three or more ports and one of the three processors access a set shared memory at a specific time. While the invention has been described in connection with a DRAM, the invention may also be applied to a static random access memory, a non-volatile memory, or the like.

As described above, a plurality of processors can smoothly access shared memory areas in the memory cell array, thereby enhancing data transmission and processing speed and reducing a system size. In addition, an occupancy state (or busy state) of the shared memory area can be promptly signaled to a processor attempting to access the shared memory area. Therefore, a more enhanced and preferred multi-processor system is provided.

Having described exemplary embodiments, it should be apparent that modifications and variations can be made by persons skilled in the art in light of the above teachings. Therefore, it is to be understood that changes may be made to embodiments of the invention disclosed that are nevertheless still within the scope and the spirit of the claims.

The invention claimed is:

1. A semiconductor memory device, comprising:
   at least one shared memory area allocated in a memory cell array;
   a plurality of ports corresponding to a plurality of processors, each port used by the corresponding processor to selectively access the shared memory area; and
   an occupancy state signaling unit to output port occupancy state information to the processor requesting access to the shared memory area through the port corresponding to the processor requesting access to the shared memory area to indicate whether access to the shared memory area is allowed;
   wherein the occupancy state signaling unit comprises:
      a plurality of decoding and generating units to decode external signals applied through the ports to generate active enable signals from the decoded external signals;
      a port output selecting unit to receive the active enable signals and output select control signals, wherein only one of the select control signals is at a logic high level at any time; and
      a plurality of occupancy state information outputting units to output respective port occupancy state information through data output pads of each port in response to the select control signals.

2. The device according to claim 1, wherein the occupancy state signaling unit outputs port occupancy state information in a first logic state through the port used for a first access request to the shared memory area and outputs port occupancy state information in a second logic state through the port used for a subsequent access request to the shared memory area.

3. The device according to claim 1, wherein the external signals are command signals applied by the processors.

4. The device according to claim 1, wherein the external signals are set command set signals applied by the processors.

5. A memory cell array in a semiconductor memory device, comprising:
   at least one shared memory area;
   first and second ports corresponding to first and second processors, each port used by the corresponding processor to selectively access the shared memory area; and
   an occupancy state signaling unit to output port occupancy state information in a first logic state through the port used for a first access request to indicate that the access to the shared memory area is allowed, and output port occupancy state information in a second logic state through the port used for a subsequent access request to indicate that access to the shared memory area is not allowed;
   wherein the occupancy state signaling unit comprises:
      first and second decoding and generating units to decode external signals applied through the first and second ports and generate active enable signals from the decoded external signals;
      a port output selecting unit to receive the active enable signals and output first and second select control signals, the first and second select control signals having opposing logic levels; and
      first and second occupancy state information outputting units to output respective port occupancy state information through data output pads corresponding to the first and second ports in response to the first and second select control signals.

6. The device according to claim 5, wherein the occupancy state signaling unit outputs port occupancy state information in a first logic state through the port used for a first access request to the shared memory area and outputs port occupancy state information in a second logic state through the port used for a subsequent access request to the shared memory area.

7. The device according to claim 5, wherein the external signals are command signals applied by the first and second processors.

8. The device according to claim 5, wherein the external signals are set command set signals applied by the first and second processors.

9. The device according to claim 5, wherein the first and second occupancy state information outputting units comprise data output buffers each disposed in a corresponding port.

10. A semiconductor memory device, comprising:
    a first group of processors and a second group of processors;
    at least one shared memory area allocated in a memory cell array, the shared memory cell area being accessible by the first group of processors and the second group of processors;
    at least one first dedicated memory area allocated in the memory cell array, the first dedicated memory area being accessible by the first group of processors;
    at least one second dedicated memory area allocated in the memory cell array, the second dedicated memory area being accessible by the second group of processors;
    a plurality of ports corresponding to the first and second groups of processors, each port used by the corresponding processor to selectively access the shared memory area and the first and second dedicated memory areas; and
    an occupancy state signaling unit to output port occupancy state information to the processor requesting access to the shared memory area and the first and second dedicated memory areas through the port corresponding to the processor requesting access to the shared memory and the first and second dedicated memory areas to indicate whether access to the shared memory area is allowed.

11. A communication system comprising:
    a first processor to perform a first set of tasks;
    a second processor to perform a second set of tasks; and
    a dynamic random access memory, comprising:

a memory cell array including a first memory area accessed by both the first and second processors and a second memory area accessed only by one of the processors;

first and second ports respectively connected to corresponding buses of the first and second processors; and an occupancy state signaling unit to output port occupancy state information to the processor requesting access to the shared memory area through the corresponding port used for requesting access, the port occupancy state information indicating whether access is allowed;

wherein the first and second processors share circuits, through the ports, to access the shared first memory area, the shared circuits including a global input/output line pair for the first memory area, a local input/output line pair operably connected to the global input/output line pair, a bit line pair operably connected to the local input/output line pair by a column select signal, a bit line sense amplifier disposed in the bit line pair for sensing and amplifying data on the bit line, and memory cells connected to the bit line pair.

12. The system according to claim 11, wherein the memory cells comprise DRAM memory cells arranged in a matrix form of rows and columns in the first and second memory areas, each cell including one access transistor and a storage capacitor.

13. The system according to claim 11, wherein each port comprises:

a data output path circuit including an input/output sense amplifier operably connected to the global input/output line pair, a data multiplexer operably connected to the input/output sense amplifier, a data output buffer connected to the data multiplexer, and a data output driver connected to the data output buffer for driving output data; and a data input path circuit including a data input buffer connected to the first port, a first input driver connected to the data input buffer for firstly driving write data, and a second input driver connected to the first input driver for secondarily driving the write data.

14. The system according to claim 11, wherein when the first processor accesses the first memory area through the first port, the second processor accesses the second memory area through the second port at substantially the same time.

15. A method for signaling shared memory area states of a semiconductor memory device to processors through ports, comprising:

receiving a first request for access to a shared memory area in a memory cell array through a first port through which a first processor of a first group of processors can access the shared memory array and a first dedicated memory area in the memory cell array;

outputting port occupancy state information at the first port responsive to the received first access request to indicate that access to the shared memory area through the first port is allowed;

receiving a second request for access to the shared memory area through a second port through which a second processor of a second group of processors can access the shared memory array and a second dedicated memory area in the memory cell array; and outputting port occupancy state information at the second port responsive to the received second access request to indicate that access to the shared memory area through the second port is not allowed when access through the first port is allowed and to indicate that access to the shared memory area through the second port is allowed when access through the first port is no longer allowed.

16. The method according to claim 15, wherein when any processor accesses the shared memory area through the selected port, another processor can, at substantially the same time, access an area other than the shared memory area through another port.

17. The method according to claim 15, wherein the port occupancy state information is output through a data output pad connected to each port.

18. The method according to claim 15, wherein outputting port occupancy state information at the first port comprises:

generating a first active signal at the first port responsive to the first access request; and generating a first select control signal in a first logic state responsive to the first active enable signal.

19. The method according to claim 18, wherein outputting port occupancy state information at the second port comprises:

generating a second active signal at the second port responsive to the second access request; and generating a second select control signal in a second logic state responsive to the second active enable signal.

* * * * *

UNITED STATES PATENT AND TRADEMARK OFFICE
CERTIFICATE OF CORRECTION

PATENT NO. : 7,596,666 B2  Page 1 of 1
APPLICATION NO. : 11/466399
DATED : September 29, 2009
INVENTOR(S) : Ahn et al.

It is certified that error appears in the above-identified patent and that said Letters Patent is hereby corrected as shown below:

Column 2, line 8, the word "3," should read -- 3. --;
Column 9, line 31, delete the word "area".

Signed and Sealed this

Twenty-second Day of December, 2009

David J. Kappos
*Director of the United States Patent and Trademark Office*